(12) United States Patent
Yun et al.

(10) Patent No.: US 9,184,174 B2
(45) Date of Patent: Nov. 10, 2015

(54) SEMICONDUCTOR DEVICES AND METHODS OF FABRICATING SEMICONDUCTOR DEVICES

(71) Applicants: Jang-Gn Yun, Hwaseong-si (KR); Hongsoo Kim, Seongnam-si (KR); Aaron Park, Seoul (KR); Hoosung Cho, Yongin-si (KR)

(72) Inventors: Jang-Gn Yun, Hwaseong-si (KR); Hongsoo Kim, Seongnam-si (KR); Aaron Park, Seoul (KR); Hoosung Cho, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/155,649

(22) Filed: Jan. 15, 2014

(65) Prior Publication Data

US 2014/0197542 A1    Jul. 17, 2014

(30) Foreign Application Priority Data

Jan. 17, 2013    (KR) .................. 10-2013-0005403

(51) Int. Cl.
*H01L 23/48* (2006.01)
*H01L 23/52* (2006.01)
*H01L 29/40* (2006.01)
*H01L 27/115* (2006.01)

(52) U.S. Cl.
CPC ...... *H01L 27/1157* (2013.01); *H01L 27/11575* (2013.01); *H01L 27/11582* (2013.01); *H01L 2924/0002* (2013.01)

(58) Field of Classification Search
CPC ............ H01L 23/5221; H01L 23/5222; H01L 23/5329; H01L 23/5226
See application file for complete search history.

(56) References Cited

U.S. PATENT DOCUMENTS

| | | | |
|---|---|---|---|
| 3,890,636 A * | 6/1975 | Harada et al. ................. | 257/752 |
| 5,000,818 A * | 3/1991 | Thomas et al. ............... | 438/619 |
| 6,078,088 A * | 6/2000 | Buynoski ...................... | 257/410 |
| 6,745,378 B2 | 6/2004 | Anazawa | |
| 6,919,637 B2 | 7/2005 | He et al. | |
| 7,005,746 B2 | 2/2006 | Kumagai | |
| 7,071,097 B2 | 7/2006 | Colburn | |
| 7,492,013 B2 | 2/2009 | Correale, Jr. | |
| 2001/0002713 A1 * | 6/2001 | Goda et al. .................... | 257/315 |
| 2001/0040274 A1 | 11/2001 | Hidaka | |
| 2003/0089996 A1 * | 5/2003 | Hau-Riege .................... | 257/774 |
| 2005/0028125 A1 * | 2/2005 | Watanabe et al. ............... | 716/13 |
| 2009/0020744 A1 * | 1/2009 | Mizukami et al. ................ | 257/4 |
| 2009/0206420 A1 * | 8/2009 | Stecher et al. ................ | 257/390 |
| 2009/0283833 A1 * | 11/2009 | Bach ............................. | 257/368 |
| 2011/0147824 A1 | 6/2011 | Son et al. | |

(Continued)

FOREIGN PATENT DOCUMENTS

KR    10-2008-0057640 A    6/2008
KR    10-2009-0066920 A    6/2009

(Continued)

*Primary Examiner* — Jarrett Stark
(74) *Attorney, Agent, or Firm* — Myers Bigel Sibley & Sajovec, PA

(57) ABSTRACT

Semiconductor devices are provided. A semiconductor device may include a substrate and a plurality of lines on the substrate. The semiconductor device may include a dielectric layer on the substrate and adjacent the plurality of lines. The semiconductor device may include a connection element in the dielectric layer. In some embodiments, the semiconductor device may include a plurality of contacts on the connection element, and a conductive interconnection on one of the plurality of contacts that are on the connection element and on a contact that is spaced apart from the connection element.

20 Claims, 20 Drawing Sheets

(56) References Cited

U.S. PATENT DOCUMENTS

2011/0204420 A1 8/2011 Kim et al.
2012/0003831 A1 1/2012 Kang et al.
2012/0070944 A1 3/2012 Kim et al.
2013/0292836 A1* 11/2013 Tang et al. .................. 257/773

FOREIGN PATENT DOCUMENTS

| KR | 10-2009-0074490 A | 7/2009 |
| KR | 10-2009-0088262 A | 8/2009 |
| KR | 10-2011-0095697 A | 8/2011 |
| KR | 10-2011-0118336 A | 10/2011 |

* cited by examiner

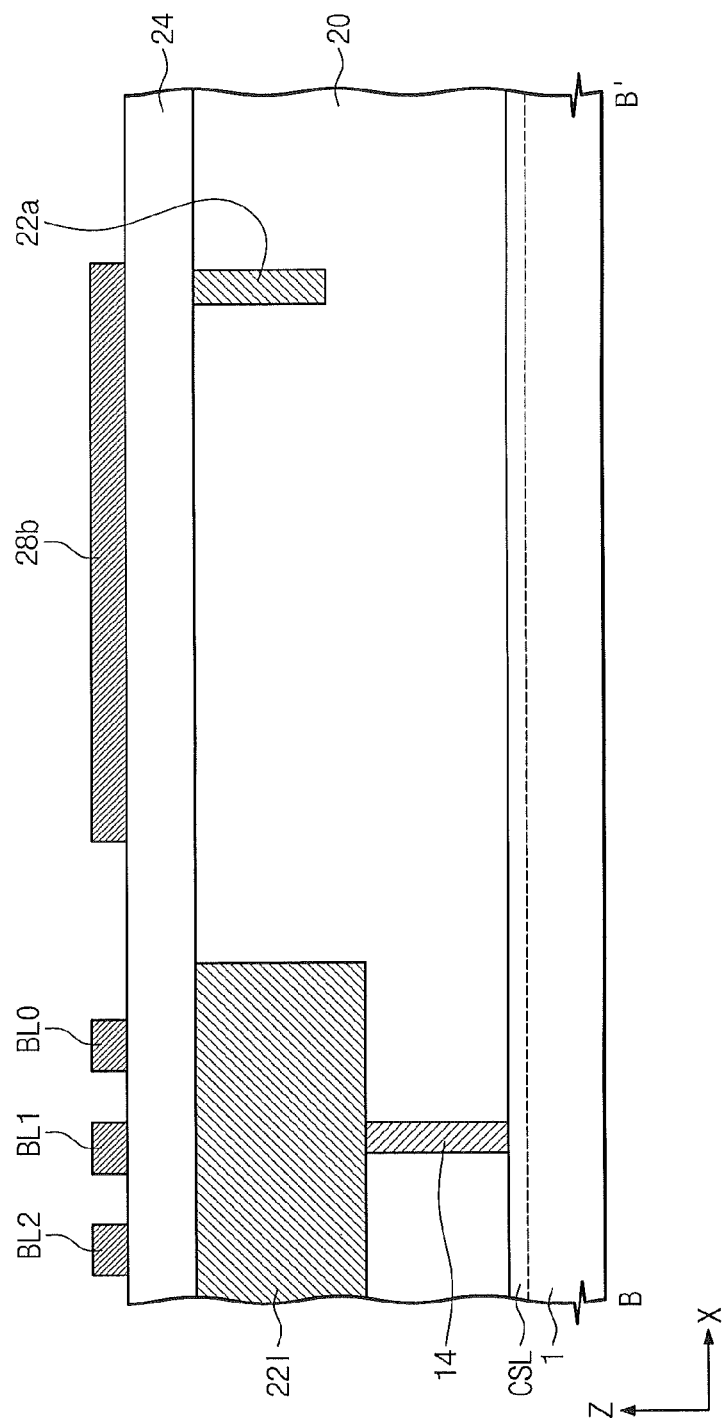

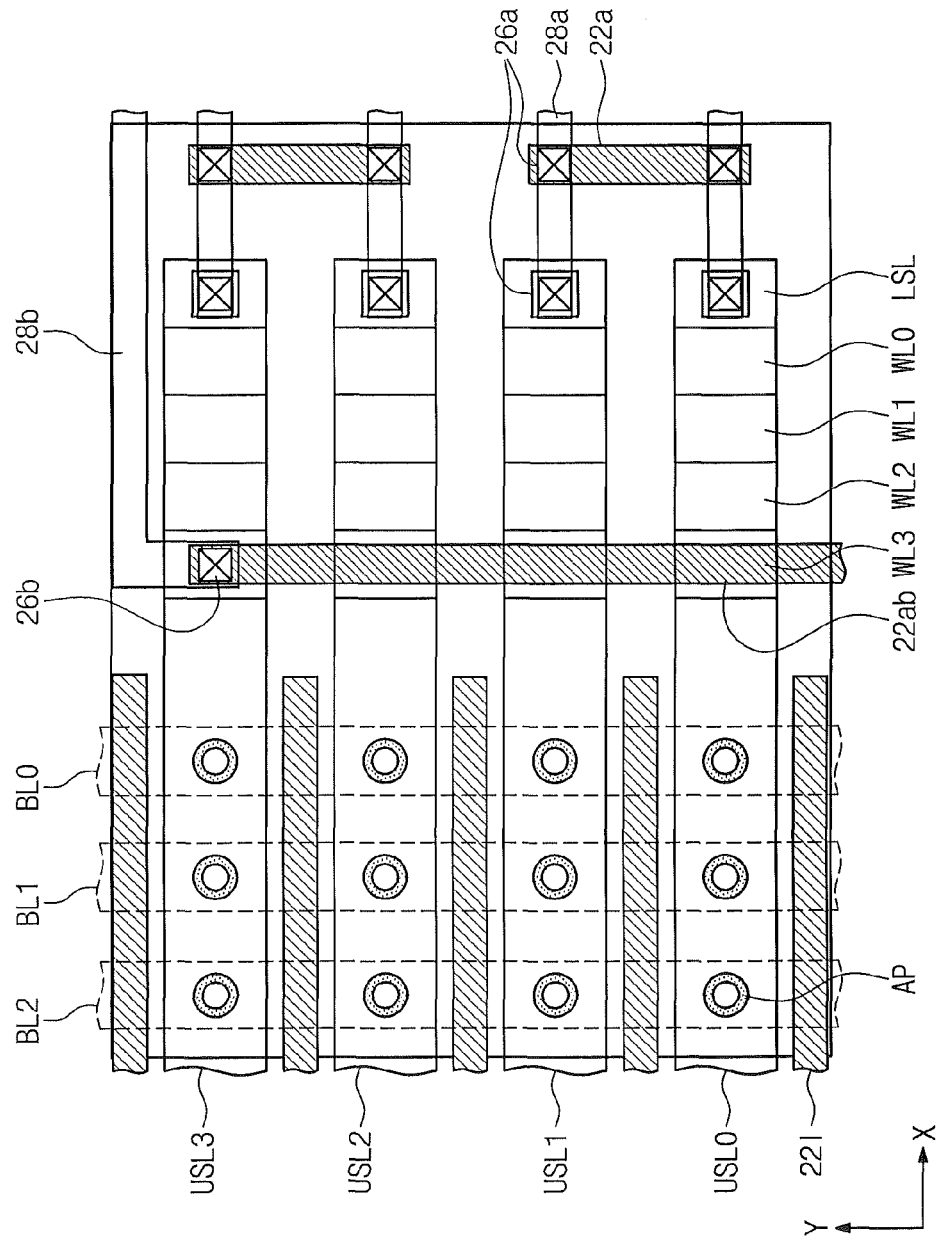

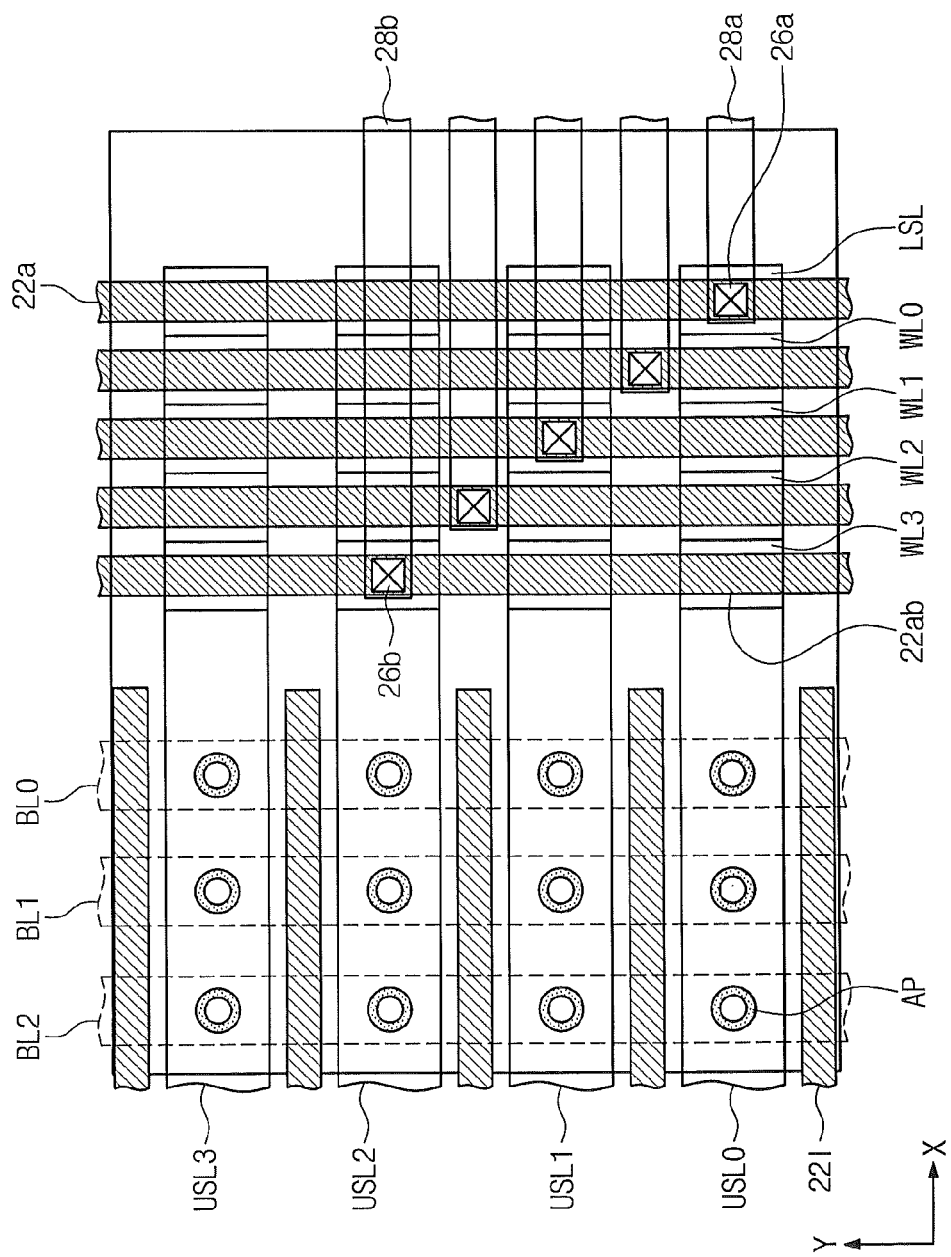

SEMICONDUCTOR DEVICES AND METHODS OF FABRICATING SEMICONDUCTOR DEVICES

CROSS-REFERENCE TO RELATED APPLICATION

This U.S. non-provisional patent application claims priority under 35 U.S.C. §119 to Korean Patent Application No. 10-2013-0005403, filed on Jan. 17, 2013, the disclosure of which is hereby incorporated herein by reference in its entirety.

BACKGROUND

The present disclosure herein relates to semiconductor devices and methods of fabricating semiconductor devices. A three-dimensional-integrated circuit (3D-IC) memory technique, as a technique for increasing memory capacity, denotes various techniques related to the three-dimensional arrangement of memory cells. Moreover, memory capacity may be increased through (1) a fine pattern technique and (2) a multi-level cell (MLC) technique, in addition to the 3D-IC memory technique. However, the fine pattern technique may be accompanied by high costs and the MLC technique may be limited to the number of bits per cell that can be increased. Accordingly, the 3D-IC technique may become a popular method for increasing memory capacity. The fine pattern and MLC techniques may also be developed independently from the 3D-IC technique, because memory capacity may be further increased when the fine pattern and MLC techniques are integrated with the 3D-IC technique.

A punch-and-plug technique has been proposed as one example of the 3D-IC technique. The punch-and-plug technique may include operations in which multilayer thin films are sequentially formed on a substrate and plugs penetrating the thin films are then formed. Because the memory capacity of a 3D memory device may be significantly increased without a significant increase in manufacturing costs when the punch-and-plug technique is used, this technique has received much attention.

SUMMARY

Various embodiments of the present inventive concepts provide a semiconductor device. The semiconductor device may include spaced-apart first and second conductive lines extending in a first direction on a substrate. The semiconductor device may include an interlayer dielectric on the first and second conductive lines. Moreover, the semiconductor device may include a connection structure configured to electrically connect the first and second conductive lines. The connection structure may include a connection element extending in a second direction that intersects the first direction. An uppermost surface of the connection element may be substantially coplanar with an uppermost surface of the interlayer dielectric, relative to an uppermost surface of the substrate. A height of a lowermost surface of the connection element may be equivalent to or lower than a height of uppermost surfaces of the first and second conductive lines, relative to the uppermost surface of the substrate.

In various embodiments, the connection element may contact the uppermost surfaces of the first and second conductive lines. In some embodiments, the connection element may be vertically non-overlapping with the first and second conductive lines. The connection structure may include first and second contact plugs in the interlayer dielectric and contacting the first and second conductive lines, respectively, and an interconnection configured to electrically connect the first and second contact plugs and the connection element. A width of the connection element may be wider than a width of either of the first and second contact plugs.

According to various embodiments, the semiconductor device may include a third conductive line between the first and second conductive lines and spaced apart therefrom. A height of a lowermost surface of the third conductive line may be equivalent to or lower than the height of the uppermost surfaces of the first and second conductive lines, relative to the uppermost surface of the substrate. Moreover, the third conductive line and the connection plate may include an equivalent material.

In various embodiments, the semiconductor device may include third and fourth conductive lines spaced apart from the first and second conductive lines and adjacent the interlayer dielectric. The connection structure may include a first connection structure. The semiconductor device may include a second connection structure configured to electrically connect the third and fourth conductive lines and spaced apart from the first connection structure. The first through fourth conductive lines may define a step-shaped pattern. Moreover, the connection element may be a first connection element. The second connection structure may be a second connection element spaced apart from the first connection element and extending in the second direction, and the second connection element may include an uppermost surface substantially coplanar with the uppermost surface of the interlayer dielectric.

A semiconductor device, according to various embodiments, may include parallel first conductive lines on the substrate. The semiconductor device may include parallel second conductive lines spaced apart from the first conductive lines and above the first conductive lines, relative to an uppermost surface of the substrate. The semiconductor device may include an interlayer dielectric on the first and second conductive lines. The semiconductor device may include a first connection structure electrically connecting the first conductive lines. The semiconductor device may include a second connection structure electrically connecting the second conductive lines. At least one of the first connection structure and the second connection structure may include a connection element extending in a first direction that intersects with a second direction in which the first and second conductive lines extend. An uppermost surface of the connection element may be substantially coplanar with an uppermost surface of the interlayer dielectric and a height of a lowermost surface of the connection element may be equivalent to or lower than a height of uppermost surfaces of the first and second conductive lines, relative to the uppermost surface of the substrate.

In various embodiments, the first conductive lines and the second conductive lines may define a stepped shape. In some embodiments, the interlayer dielectric may be a first interlayer dielectric, and the semiconductor device may include a second interlayer dielectric on the first interlayer dielectric. Moreover, the first connection structure may include a first connection element contacting the first conductive lines, a first connection contact in the second interlayer dielectric and contacting the first connection element, and a first connection interconnection contacting the first connection contact. The second connection structure may include a second connection element contacting the second conductive lines, a second connection contact in the second interlayer dielectric and contacting the second connection element, and a second connection interconnection contacting the second connection contact. The first connection interconnection and the second connection interconnection may be spaced apart from each other.

According to various embodiments, the interlayer dielectric may be a first interlayer dielectric, and the semiconductor device may include a second interlayer dielectric on the first interlayer dielectric. Moreover, the first connection structure may include a first connection element contacting the first conductive lines, a first connection contact in the second interlayer dielectric and contacting the first connection element, and a first connection interconnection contacting the first connection contact. The second connection structure may include a second connection contact that contacts the second conductive lines, a third connection contact in the second interlayer dielectric and contacting the second connection contact, a second connection interconnection contacting the third connection contact, a fourth connection contact in the second interlayer dielectric and spaced apart from the third connection contact, and a second connection element that contacts the fourth connection contact, is in the first interlayer dielectric, and is spaced apart from the second conductive lines. The first connection interconnection and the second connection interconnection may be spaced apart from each other.

In various embodiments, the interlayer dielectric may be a first interlayer dielectric, and the semiconductor device may include a second interlayer dielectric on the first interlayer dielectric. The first connection structure may include a first connection contact that contacts the first conductive lines, a second connection contact in the second interlayer dielectric and contacting the first connection contact, and a first connection interconnection contacting the second connection contact. The second connection structure may include a third connection contact that contacts the second conductive lines, a fourth connection contact in the second interlayer dielectric and contacting the third connection contact, a second connection interconnection contacting the fourth connection contact, a fifth connection contact in the second interlayer dielectric and spaced apart from the fourth connection contact, and the connection element that contacts the fifth connection contact, is in the first interlayer dielectric, and is spaced apart from the second conductive lines. Moreover, the first connection interconnection and the second connection interconnection may be spaced apart from each other.

A semiconductor device, according to various embodiments, may include a plurality of word lines on a substrate. The semiconductor device may include a dielectric layer on the substrate and adjacent the plurality of word lines. The semiconductor device may include a connection element including a conductive material in the dielectric layer. The semiconductor device may include a plurality of contacts on the connection element. Moreover, the semiconductor device may include a conductive interconnection on one of the plurality of contacts that are on the connection element and on a contact that is spaced apart from the connection element.

In various embodiments, the semiconductor device may include a selection line underlying the plurality of word lines, and the contact that is spaced apart from the connection element may overlap the selection line. In some embodiments, the connection element may be spaced apart from, and non-overlapping with, the plurality of word lines and the selection line. Moreover, the semiconductor device may include a common source line underlying the dielectric layer, and the connection element may overlap the common source line.

According to various embodiments, the one of the plurality of contacts on the connection element may be a first contact on the connection element. The semiconductor device may include a second contact, among the plurality of contacts, on the connection element. The conductive interconnection may include a first conductive interconnection. The semiconductor device may include a second conductive interconnection on the second contact that is on the connection element and on another contact that is spaced apart from the connection element. Moreover, the semiconductor device may include a third conductive interconnection that is between the first and second conductive interconnections and that overlaps the plurality of word lines. In some embodiments, the semiconductor device may include a selection line underlying the plurality of word lines, and a connection contact configured to electrically connect the selection line to one of: the contact that is spaced apart from the connection element; and the another contact that is spaced apart from the connection element. In some embodiments, the connection contact may be a first connection contact. Moreover, the semiconductor device may include a second connection contact that is configured to electrically connect the third conductive interconnection to one of the plurality of word lines.

BRIEF DESCRIPTION OF THE DRAWINGS

The above and other features and advantages of the disclosure will become more apparent in view of the attached drawings and accompanying detailed description.

FIGS. 2B, 2C, and 2D are cross-sectional views taken along lines A-A', B-B', and C-C', respectively, of FIG. 2A.

FIG. 4A is a plan view illustrating a semiconductor device according to various embodiments of the present inventive concepts.

FIG. 7A is a plan view illustrating a semiconductor device according to various embodiments of the present inventive concepts.

DETAILED DESCRIPTION

Figure 1:
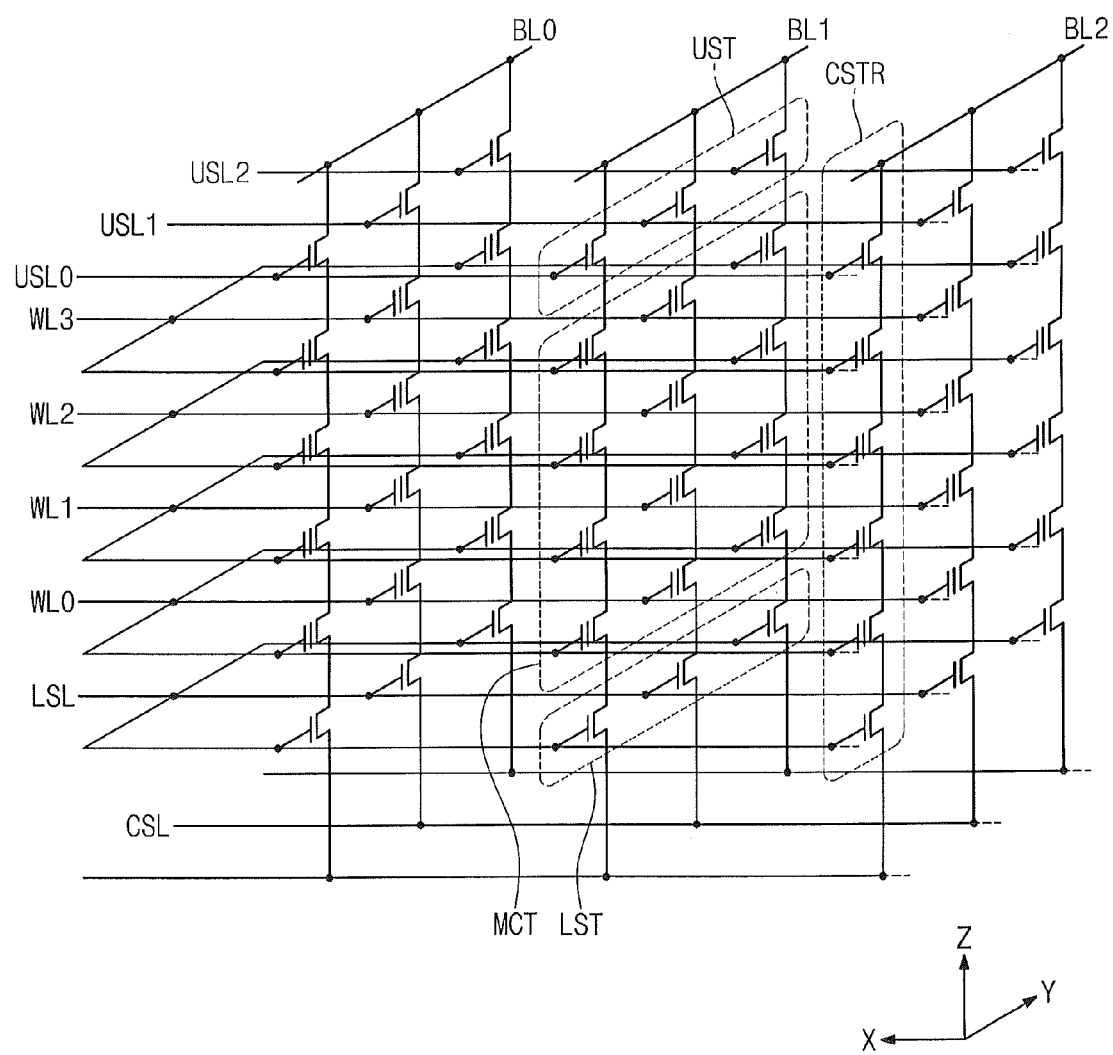
FIG. 1 is a circuit diagram of a semiconductor device according to various embodiments of the present inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 2A:
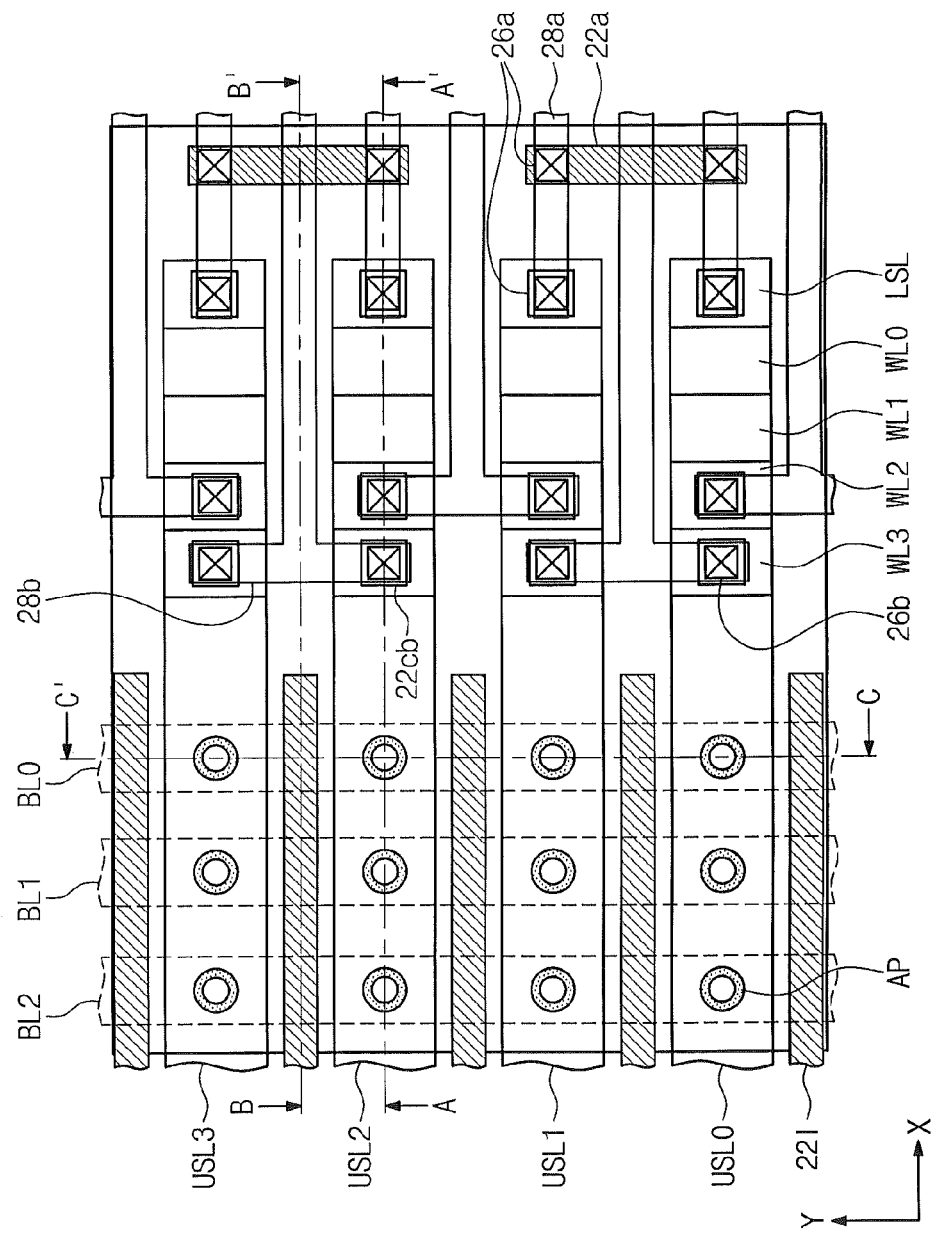
FIG. 2A is a plan view illustrating a semiconductor device according to various embodiments of the present inventive concepts.
Figure 2B:
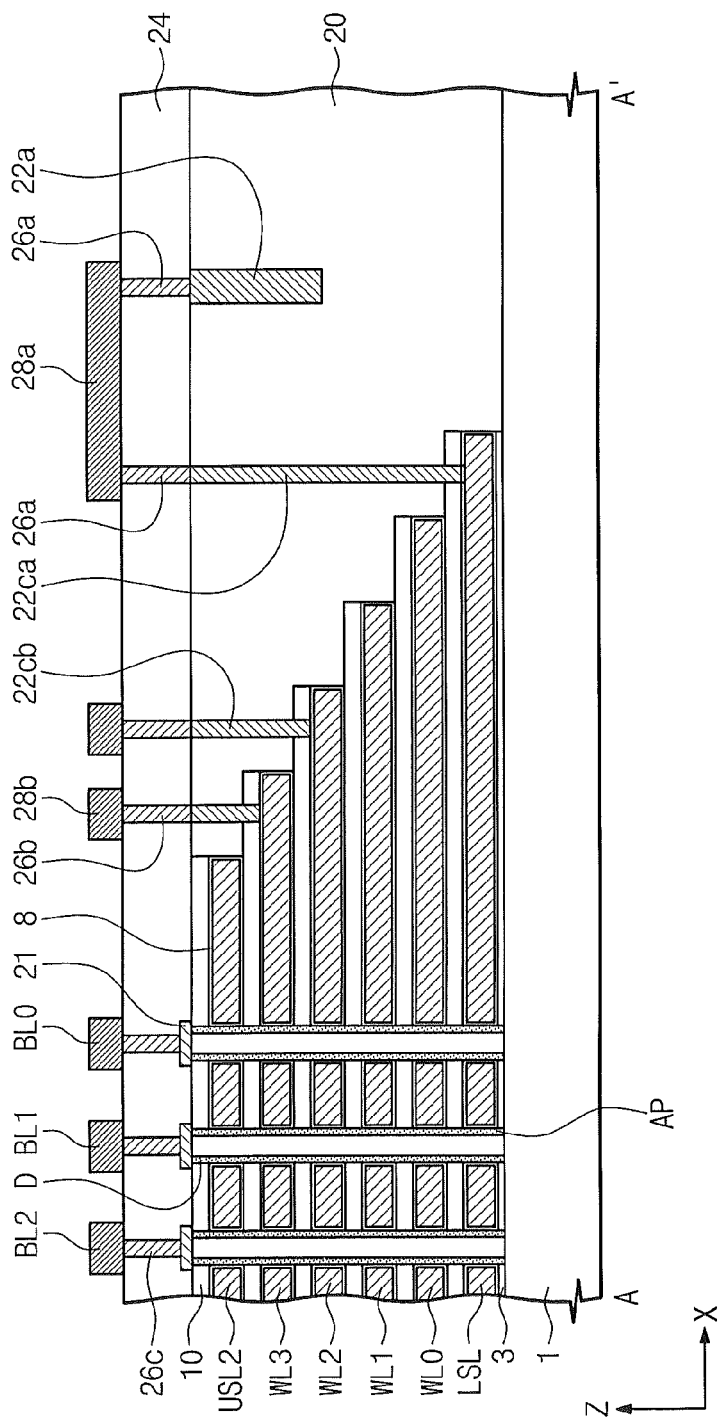
Figure 2D:
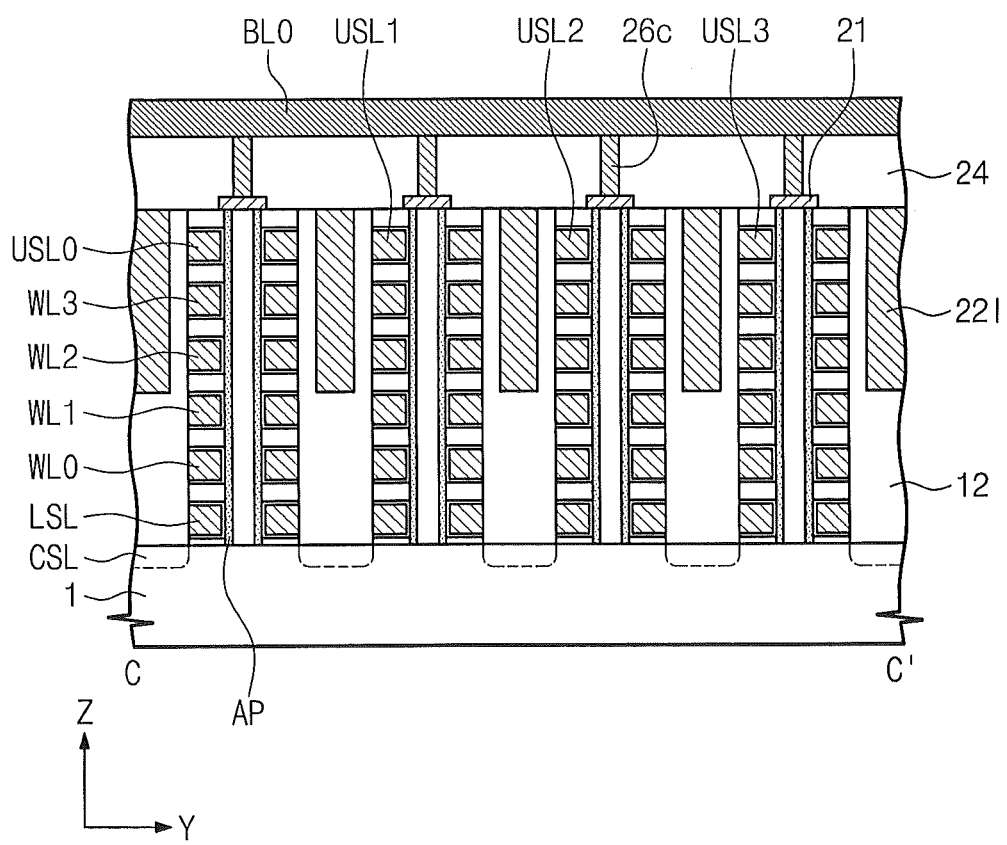
Figure 2E:
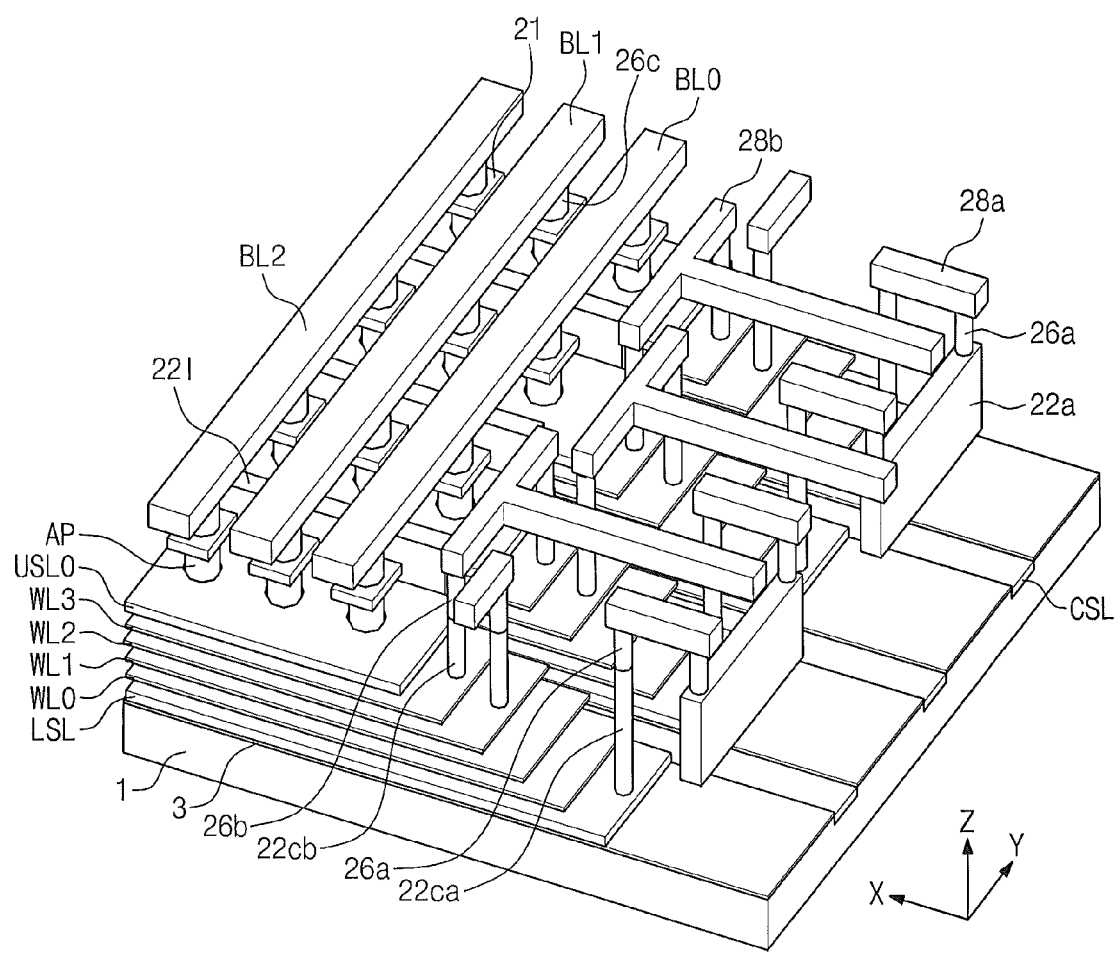
FIG. 2E is a perspective view illustrating a semiconductor device having the plan view of FIG. 2A.

A non-volatile memory device, according to various embodiments of the present inventive concepts, may be a three-dimensional semiconductor device having a three-dimensional structure. For example, FIG. 1 is a circuit diagram of a semiconductor device according to various embodiments of the present inventive concepts. FIG. 2A is a plan view illustrating a semiconductor device according to various embodiments of the present inventive concepts. FIGS. 2B, 2C, and 2D are cross-sectional views respectively taken along lines A-A', B-B', and C-C' of FIG. 2A. FIG. 2E is a perspective view illustrating a semiconductor device having the plan view of FIG. 2A.

Referring to FIGS. 1 and 2A to 2E, a vertical-type semiconductor memory device according to various embodiments of the present inventive concepts may include a common source line CSL, a plurality of bit lines BL0, BL1 and BL2, and a plurality of cell strings CSTR disposed between the common source line CSL and the bit lines BL0 to BL2. The common source line CSL may be an impurity-doped region existing in a substrate 1. The semiconductor substrate 1 may be a semiconductor substrate itself or an epitaxial semiconductor layer formed thereon. The bit lines BL0 to BL2 may be conductive lines that are spaced apart from the semiconductor substrate 1 and disposed thereabove. The bit lines BL0 to BL2 may be two-dimensionally arranged, and the plurality of cell strings CSTR may be connected in parallel to each bit line. As a result, the cell strings CSTR may be two-dimensionally arranged on the semiconductor substrate 1.

Each cell string CSTR may be composed of a lower selection transistor LST in contact with the common source line CSL, an upper selection transistor UST in contact with the bit lines BL0 to BL2, and a plurality of memory cell transistors MCT disposed between the lower and upper selection transistors LST and UST. The lower selection transistor LST, the upper selection transistor UST, and the memory cell transistors MCT may be connected in series. In addition, a lower selection line LSL, a plurality of word lines WL0 to WL3, and a plurality of upper selection lines USL0 to USL2, which are disposed between the common source line CSL and the bit lines BL0 to BL2, may be respectively used as gate electrodes of the lower selection transistor LST, the memory cell transistors MCT, and the upper selection transistors UST. The common source line CSL, the lower selection line LSL, the word lines WL, and the upper selection lines USL may extend in a first direction X. The bit lines BL may extend in a second direction Y crossing the first direction X.

The lower selection transistors LST may be disposed at the substantially same distance from the semiconductor substrate 1, and the gate electrodes may be in an equipotential state by being commonly connected to the lower selection line LSL. Similarly, the gate electrodes of the plurality of memory cell transistors MCT disposed at the substantially same distance from the common source line CSL may also be in an equipotential state by being commonly connected to one of the word lines WL0 to WL3. Because a single cell string CSTR is composed of the plurality of memory cell transistors MCT having different distances from the common source line CSL, the multilayer word lines WL0 to WL3 are disposed between the common source line CSL and the bit lines BL0 to BL2.

Each cell string CSTR may include an active pattern AP that vertically extends from the semiconductor substrate 1 to be in contact with the bit lines BL0 to BL2. The active pattern AP may be formed to penetrate the upper selection lines USL0 to USL2, the lower selection line LSL, and the word lines WL0 to WL3.

A gate dielectric 8 may be disposed between the lines USL, LSL and WL and the active pattern AP. According to some embodiments, the gate dielectric 8 may include a tunnel dielectric layer, a charge trap layer, and a blocking dielectric layer. The charge trap layer may not be disposed between the lower selection line LSL and the active pattern AP, or the upper selection lines USL0 to USL2 and the active pattern AP. A common drain region D is disposed at an upper end of the active pattern AP and in contact with a conductive pad 21. The lower and upper selection transistors LST and UST and the memory cell transistors MCT may be metal-oxide-semiconductor field-effect transistors (MOSFETs) using the active pattern AP as a channel region.

A buffer oxide layer 3 may be disposed on the substrate 1. Gate interlayer dielectric patterns 10 are disposed on a top surface of the upper selection line USL, between the upper selection line USL and the word line WL3, between the word lines WL0 to WL3, and between the word line WL0 and the lower selection line LSL. A buried insulation pattern 12 is disposed between the upper selection lines USL0 to USL2, and thus, the upper selection lines USL0 to USL2 may be separated. The buried insulation pattern 12 may extend to be disposed between the word lines WL0 to WL3 and between the lower selection lines LSL.

Ends of the lines LSL, WL and USL may have a stepped shape. The ends of the lines LSL, WL and USL and the substrate 1 are covered with a first interlayer dielectric 20. The lines LSL, WL and USL and the first interlayer dielectric 20 are covered with a second interlayer dielectric 24. The bit lines BL are disposed on the second interlayer dielectric 24. The bit lines BL are respectively connected to the conductive pads 21 by bit line contacts 26c.

The word lines WL disposed at the same height may be connected in common as described herein. Also, the lower selection lines LSL may be connected in common. In various embodiments of the present inventive concepts, connection plates 22a disposed in the first interlayer dielectric 20 are used to be connected in common. The connection plate 22a may have a top surface coplanar with a top surface of the first interlayer dielectric 20. A height of a bottom surface of the connection plate 22a may be disposed between a height of a top surface of the uppermost word line WL3 and a height of a top surface of the substrate 1. The connection plate 22a may have a shape elongated in the second direction Y. A width of the connection plate 22a may be greater than that of the common source line CSL. The connection plate 22a may be vertically overlapped with the common source line CSL.

In some embodiments, the connection plate 22a may be spaced apart from the word lines WL0 to WL3 and the lower selection lines LSL without being vertically overlapped therewith. The ends of the lower selection lines LSL and the word lines WL0 to WL3 are respectively in contact with the first and second connection contacts 22ca and 22cb. The first and second connection contacts 22ca and 22cb are disposed in the first interlayer dielectric 20 and may have a top surface coplanar with the top surface of the first interlayer dielectric 20.

Conductive lines 221 spaced apart from the lines USL, WL and LSL are disposed in the buried insulation pattern 12. The conductive line 221 is connected to the common source line CSL by a source connection contact 14. The conductive line 221 may have a top surface coplanar with a top surface of the buried insulation pattern 12. A height of a bottom surface of the conductive line 221 may be disposed between the height of the top surface of the uppermost word line WL3 and the height of the top surface of the substrate 1. The conductive line 221 may increase a transfer rate of an electric signal applied to the common source line CSL by being formed of a material having an electrical resistance lower than the common source line CSL.

The connection plate 22a, the first and second connection contacts 22ca and 22cb, and the conductive lines 221 may be simultaneously formed. Therefore, the connection plate 22a, the first and second connection contacts 22ca and 22cb, and the conductive line 221 may be formed of the same material.

Third and fourth connection contacts 26a and 26b respectively in contact with the first and second connection contacts 22ca and 22cb and the connection plate 22a are disposed in the second interlayer dielectric 24. Connection interconnections 28a and 28b in contact with the third and fourth connection contacts 26a and 26b are disposed on the second interlayer dielectric 24.

The word lines WL and the lower selection lines LSL having the same height may be respectively connected in common by using the connection plate 22a, the first to fourth connection contacts 22ca, 22cb, 26a and 26b, and the connection interconnections 28a and 28b. In some embodiments, the word lines WL may be connected by the second connection contact 22cb in contact with the end of the word line WL, the fourth connection contact 26b, and the second connection interconnection 28b. The lower selection lines LSL are connected through the first connection contact 22ca in contact with the end of the lower selection line LSL, the third connection contact 26a, the first connection interconnection 28a, and the connection plate 22a. Because the top surface of the connection plate 22a is disposed lower than the top surface of the connection interconnection 28a, a space may remain between adjacent first connection interconnections 28a. The second connection interconnection 28b electrically connected to the word lines WL0 to WL3 may be disposed in the space. Therefore, in various embodiments of the present inventive concepts, the degree of freedom in interconnection of the connection interconnections 28a and 28b may be increased by using the connection plate 22a.

Methods of fabricating a semiconductor device according to various embodiments of the present inventive concepts are also described herein. For example, FIGS. 3A through 3C are cross-sectional views respectively illustrating a process of fabricating a semiconductor device having cross sections of FIGS. 2B, 2C, and 2D.

Figure 3A:
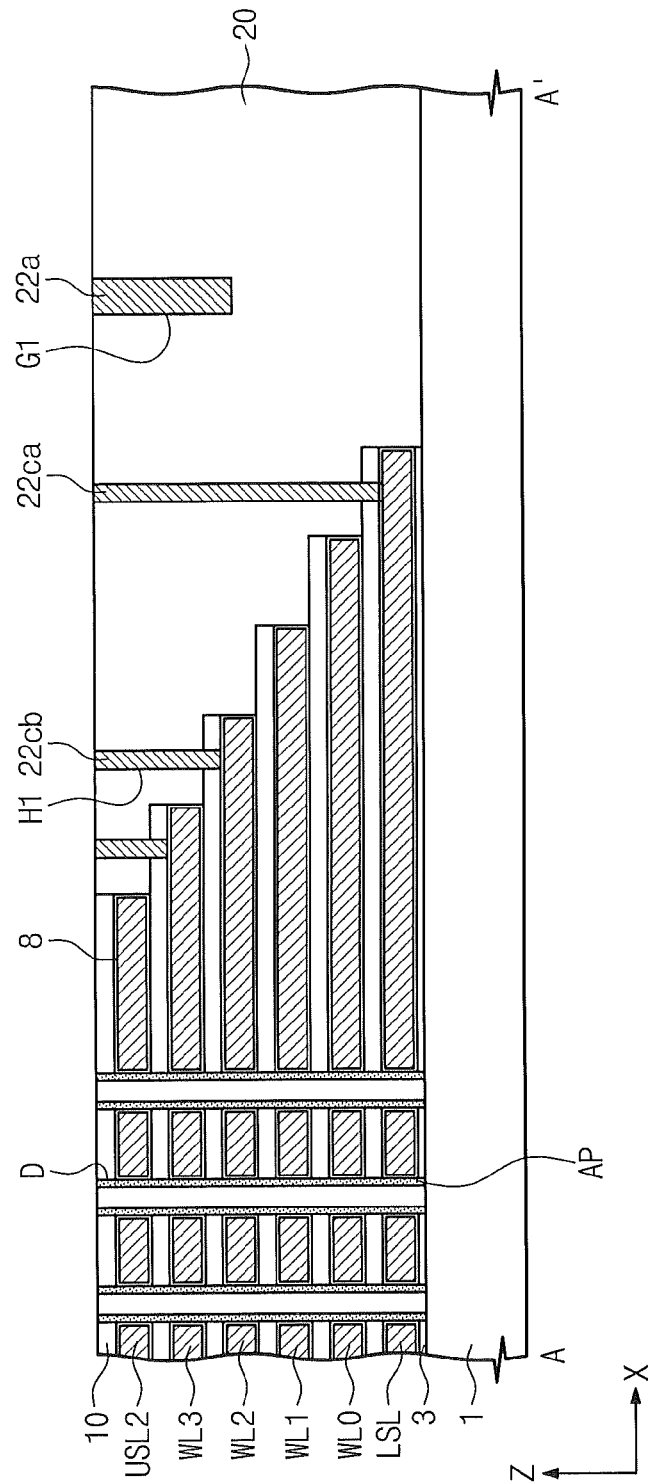
FIGS. 3A through 3C are cross-sectional views illustrating a process of fabricating a semiconductor device having the cross sections of FIGS. 2B, 2C, and 2D, respectively.
Figure 3B:
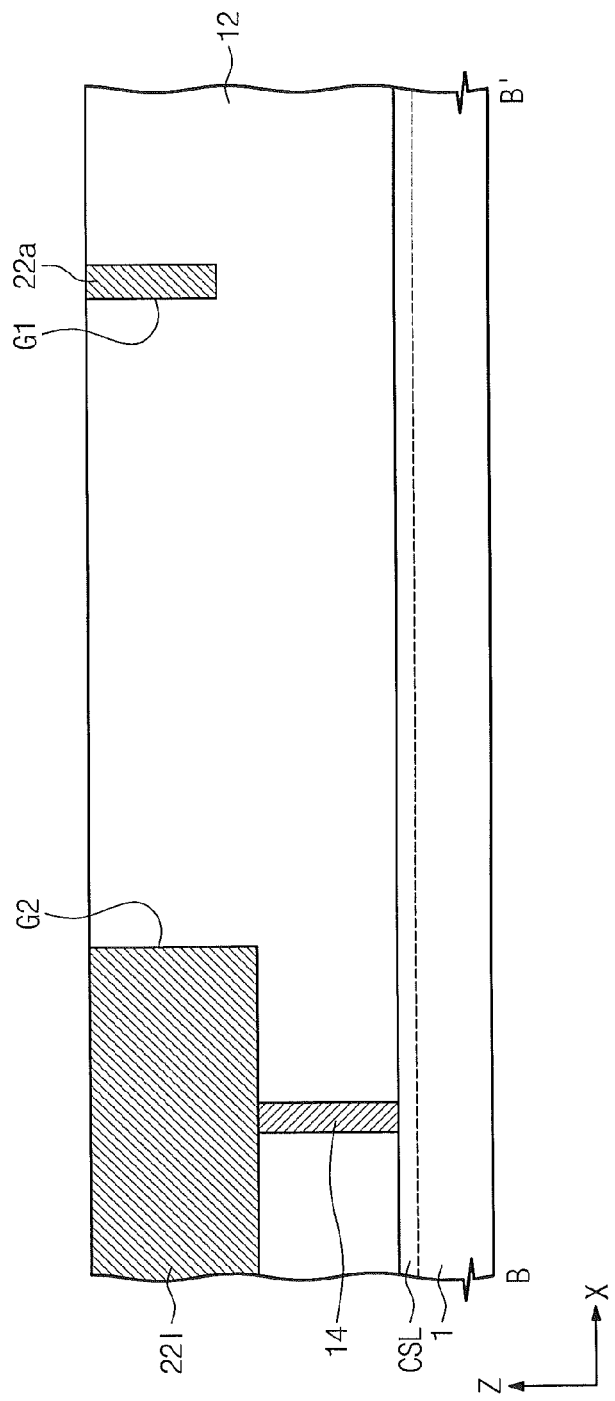
Figure 3C:
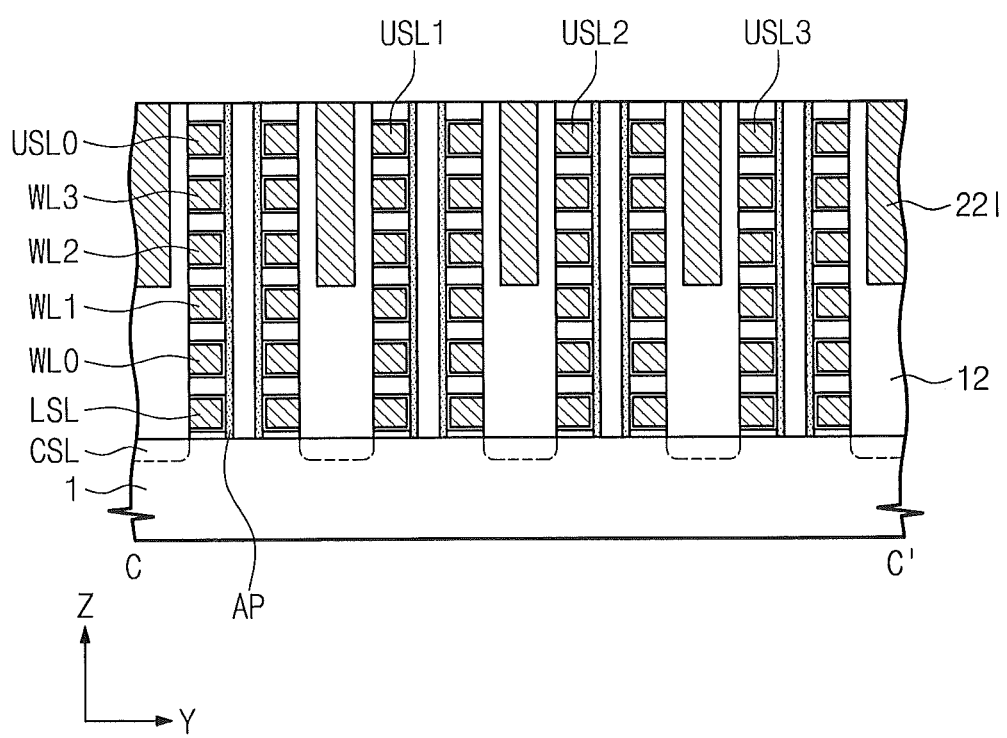

Referring to FIGS. 3A to 3C, a structure of a three-dimensional semiconductor device including lower selection lines LSL, word lines WL0 to WL3, upper selection lines USL0 to USL3, active patterns AP, a buried insulation pattern 12, and a first interlayer dielectric 20 may be formed on a substrate 1 by using methods disclosed in U.S. Patent Publication Nos. 2011/0147824, 2012/0003831, and 2012/0070944. Holes H1 exposing top surfaces of the gate interlayer dielectric patterns 10 and a connection plate groove G1 are formed by patterning the first interlayer dielectric 20. The holes H1 may be respectively formed on top surfaces of the word lines WL0 to WL3 and the lower selection line LSL. Depths of the holes H1 may be different from one another. The holes H1 having different depths may be simultaneously formed or may be formed by different etching processes through using a mask several times. When patterning the first interlayer dielectric 20, the buried insulation pattern 12 is also patterned to form a conductive line groove G2. The gate interlayer dielectric pattern 10 at bottoms of the holes H1 is removed to expose the top surfaces of the word lines WL0 to WL3 and the lower selection line LSL. The holes H1, the connection plate groove G1, and the conductive line groove G2 are filled with a conductive layer, and a planarization etching process is then performed to form first and second connection contacts 22cb and 22ca, a connection plate 22a, and a conductive line 221, respectively. A source connection contact 14 may be formed in the buried insulation pattern 12 in advance before the conductive line groove G2 is formed. Also, the source connection contact 14 may be formed simultaneously with the conductive line 221. In this case, a method of forming a dual-damascene hole may be used when forming the conductive line groove G2. Subsequently, interconnections are formed with reference to FIGS. 2A to 2E.

Figure 4B:
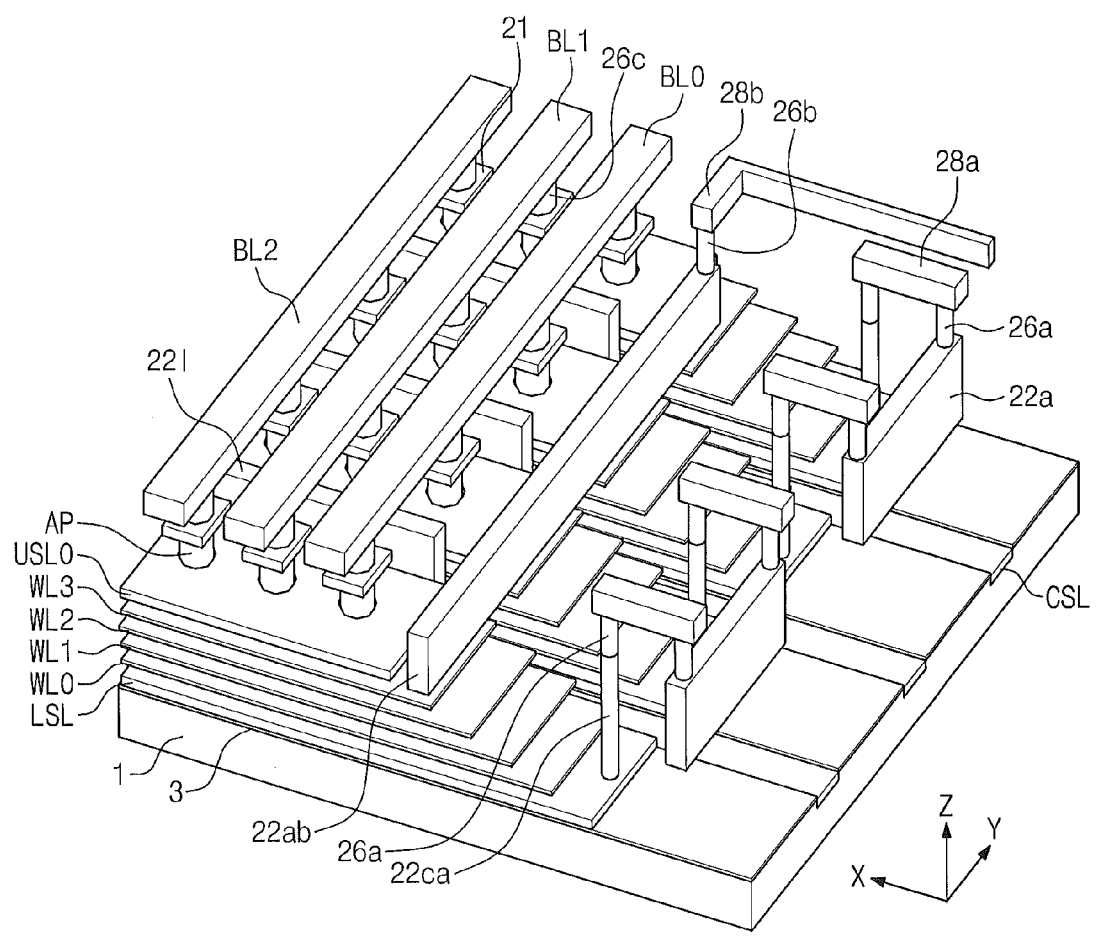
FIG. 4B is a perspective view illustrating a semiconductor device having the plan view of FIG. 4A.

FIG. 4A is a plan view illustrating a semiconductor device according to various embodiments of the present inventive concepts. FIG. 4B is a perspective view illustrating a semiconductor device having the plan view of FIG. 4A.

Referring to FIGS. 4A and 4B, the semiconductor device, according to various embodiments, includes a first connection plate 22a and a second connection plate 22ab. The first connection plate 22a may be the same as the connection plate 22a described with respect to FIG. 2A. In some embodiments, the second connection plate 22ab may be simultaneously in contact with ends of uppermost word lines W3. The semiconductor device of FIG. 4A may not include the second connection contact 22cb of FIG. 2A. A height of a top surface of the second connection plate 22ab may be the same as a height of a top surface of the first connection plate 22a. One end of the second connection plate 22ab is connected to a fourth connection contact 26b and electrically connected to a second connection interconnection 28b. The second connection interconnection 28b may be bent to be disposed so as not to be in contact with first connection interconnections 28a. Other configurations may be the same or similar to that of FIGS. 2A-2D.

Figure 5A:
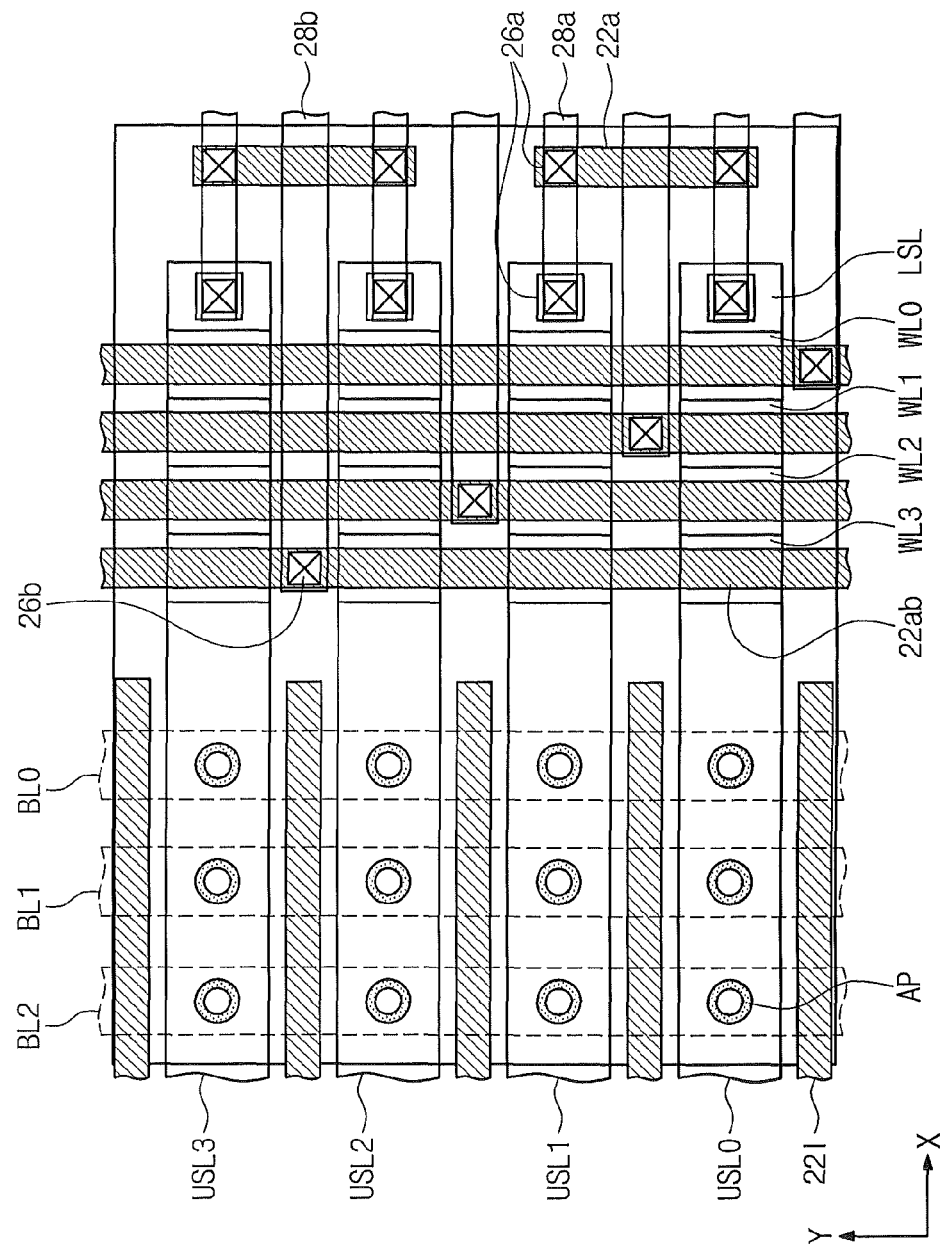
FIG. 5A is a plan view illustrating a semiconductor device according to various embodiments of the present inventive concepts.
Figure 5B:
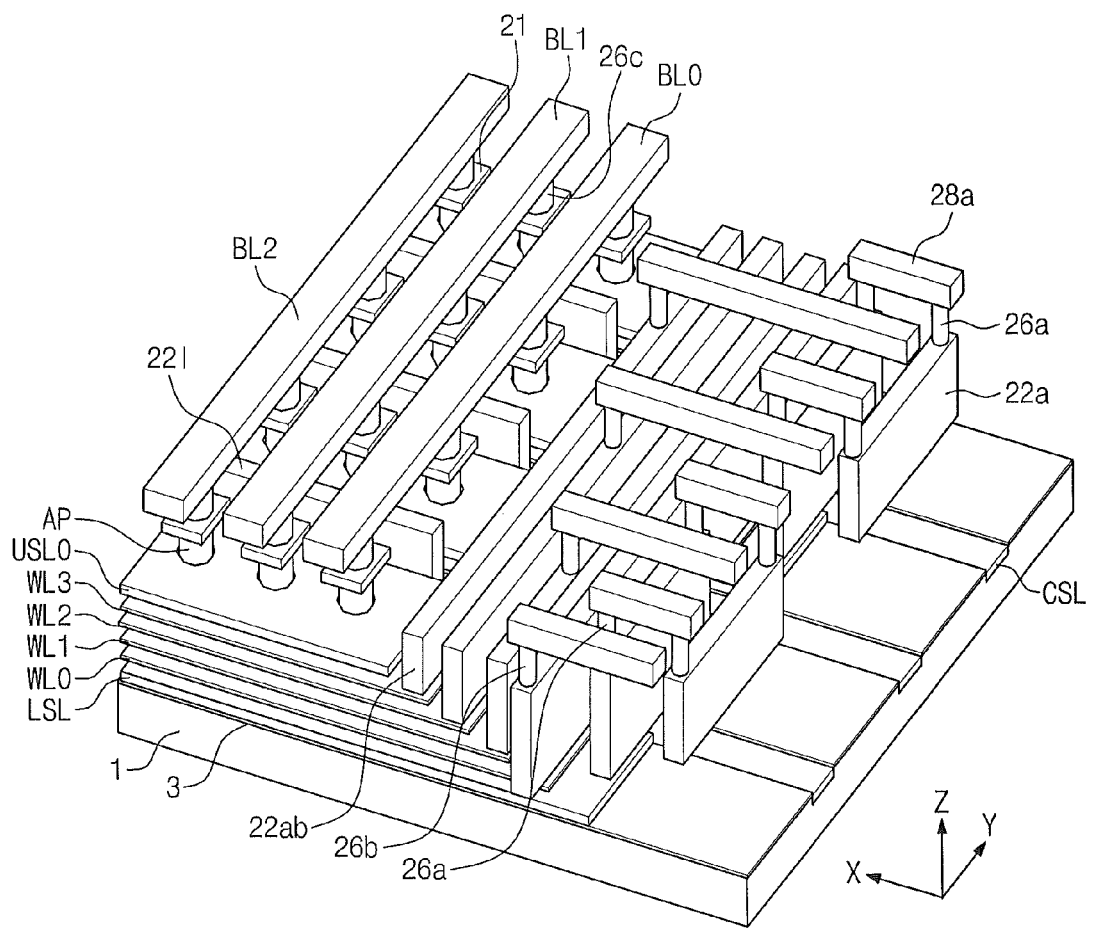
FIG. 5B is a perspective view illustrating a semiconductor device having the plan view of FIG. 5A.

FIG. 5A is a plan view illustrating a semiconductor device according to various embodiments of the present inventive concepts. FIG. 5B is a perspective view illustrating a semiconductor device having the plan view of FIG. 5A.

Referring to FIGS. 5A and 5B, in the semiconductor device, according to various embodiments, ends of all word lines WL0 to WL3 are respectively in contact with second connection plates 22ab and second connection interconnections 28b may be disposed between first connection interconnections 28a. The present semiconductor device may not include the first and second connection contacts 22ca and 22cb of FIG. 2B. Other configurations may be the same or similar to FIGS. 4A, 4B.

Figure 6A:
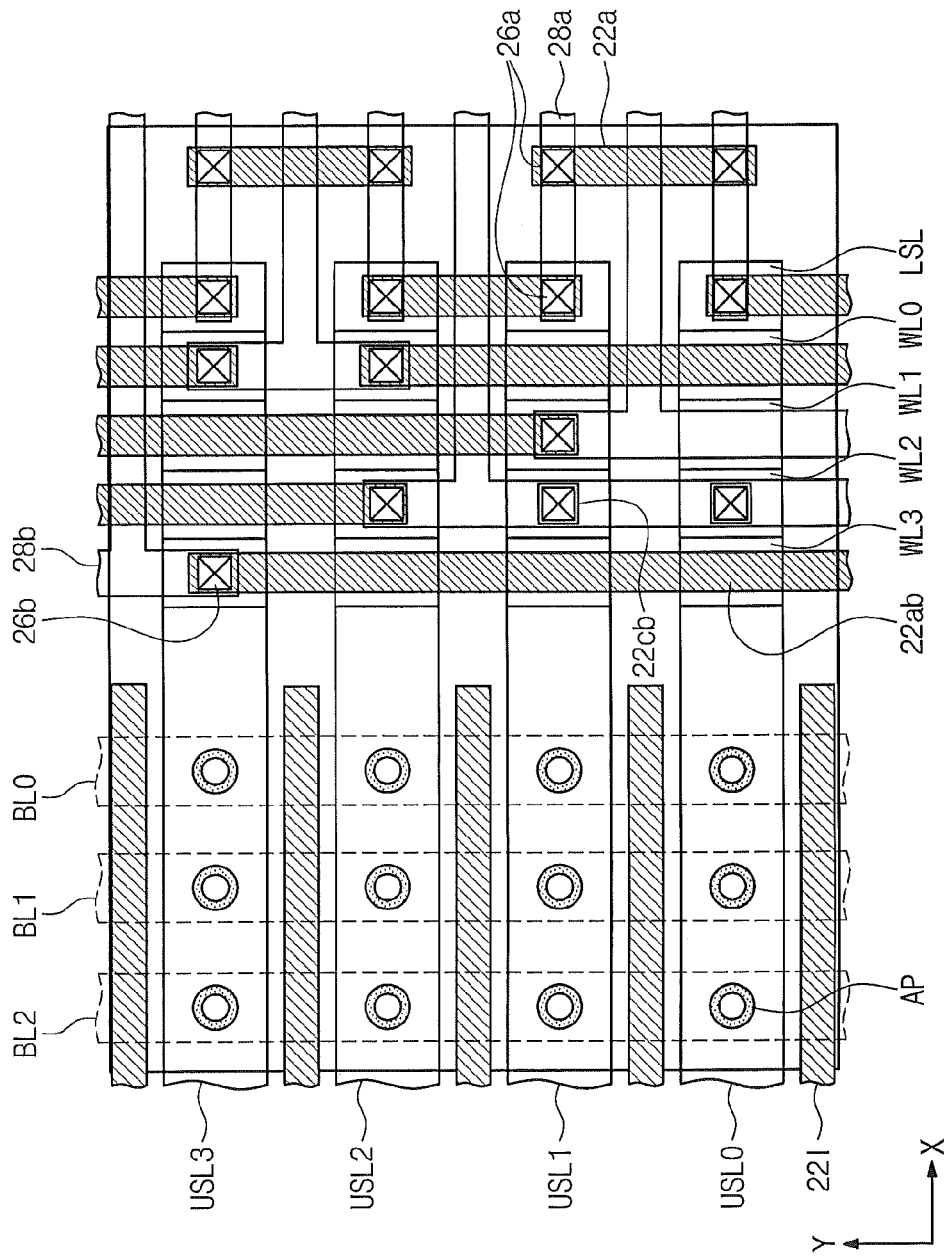
FIG. 6A is a plan view illustrating a semiconductor device according to various embodiments of the present inventive concepts.
Figure 6B:
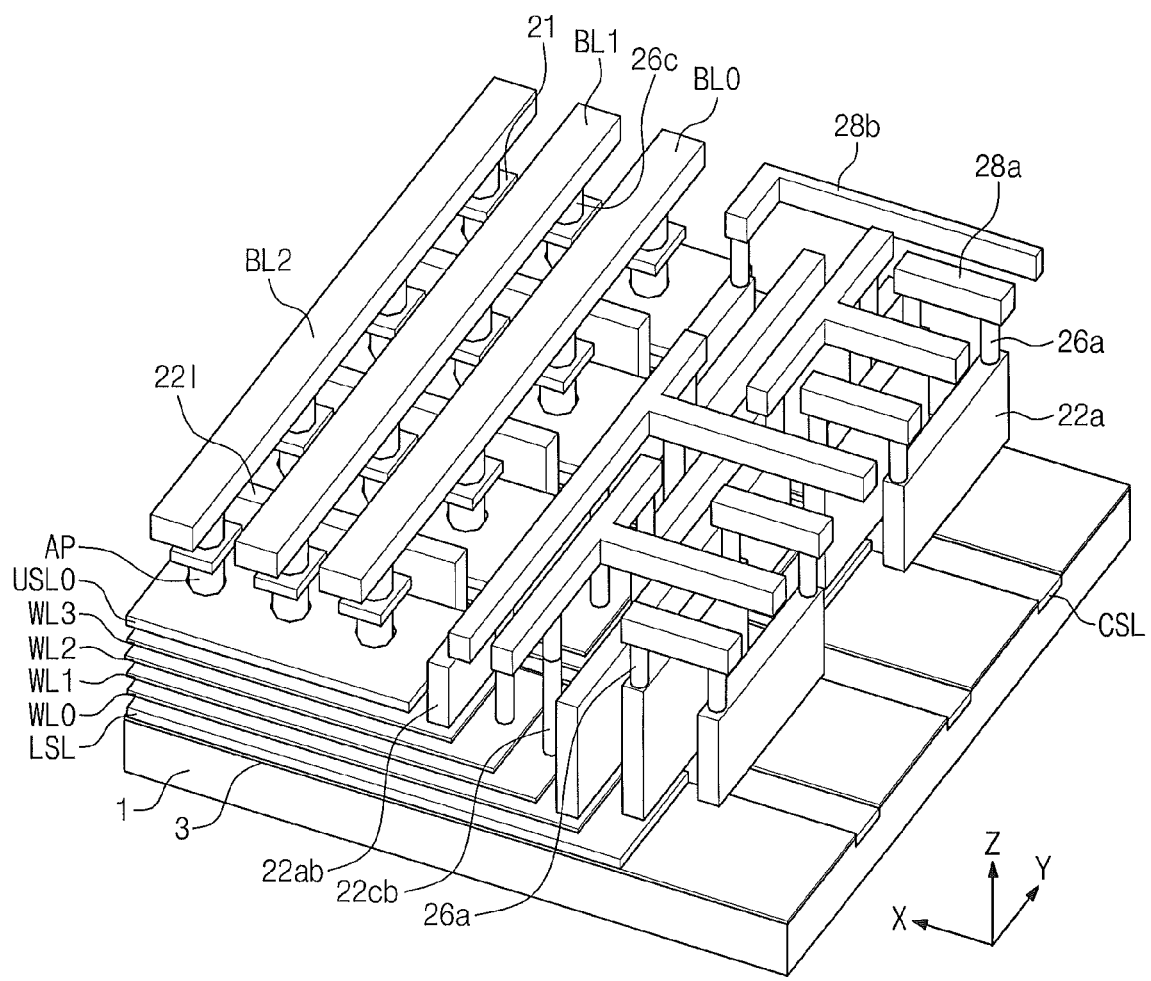
FIG. 6B is a perspective view illustrating a semiconductor device having the plan view of FIG. 6A.

FIG. 6A is a plan view illustrating a semiconductor device according to various embodiments of the present inventive concepts. FIG. 6B is a perspective view illustrating a semiconductor device having the plan view of FIG. 6A.

Referring to FIGS. 6A and 6B, the semiconductor device according to various embodiments has a configuration in which configurations of the semiconductor devices of FIGS. 2A, 4A, and 5A are combined. That is, the semiconductor device, according to various embodiments, may use a first connection plate 22a, a second connection plate 22ab, and a second connection contact 22cb. Other configurations may be the same or similar to FIGS. 2A-2D, 4A, 4B, 5A, and 5B.

Figure 7B:
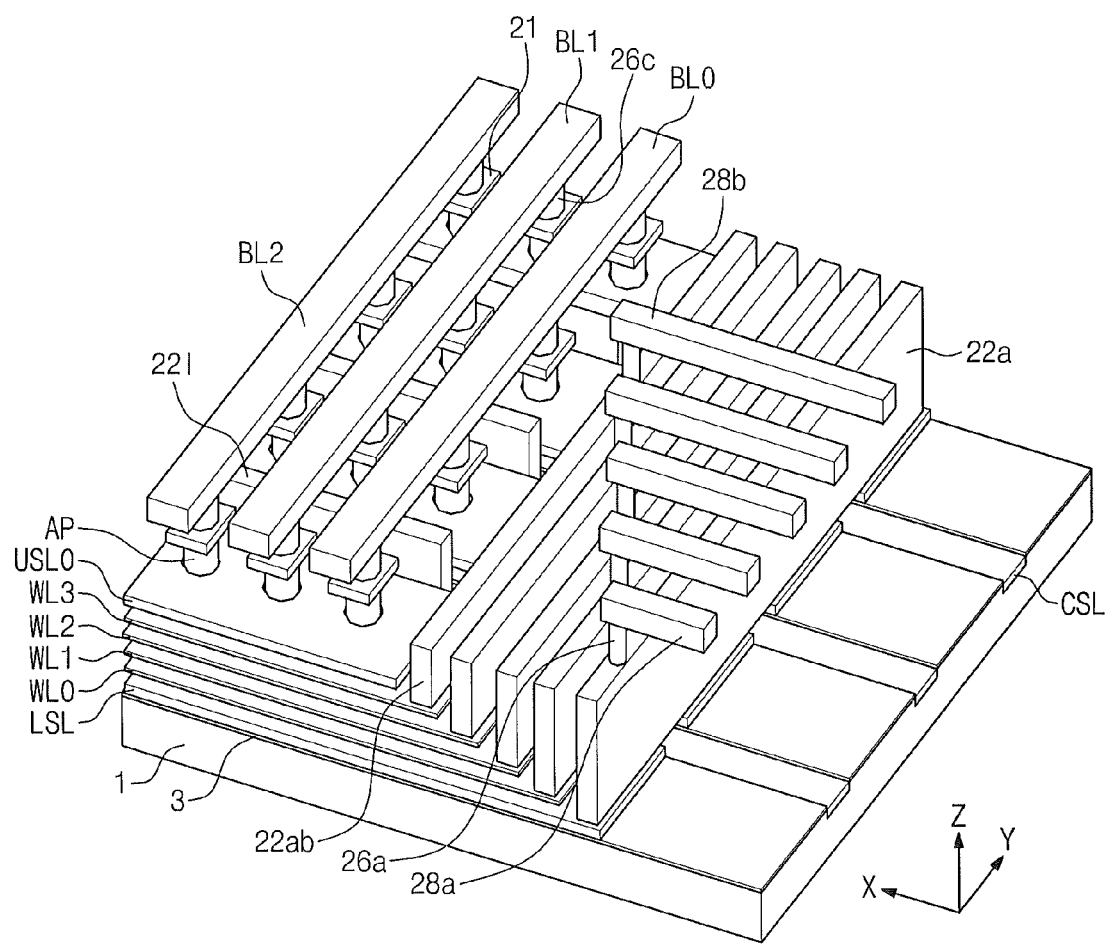
FIG. 7B is a perspective view illustrating a semiconductor device having the plan view of FIG. 7A.

FIG. 7A is a plan view illustrating a semiconductor device according to various embodiments of the present inventive concepts. FIG. 7B is a perspective view illustrating a semiconductor device having the plan view of FIG. 7A.

Referring to FIGS. 7A and 7B, in the semiconductor device, according to various embodiments, a first connection plate 22a may be directly in contact with ends of lower selection lines LSL. Other configurations may be the same or similar to FIGS. 5A, 5B.

A semiconductor device, according to various embodiments, has been described in relation to a vertical NAND flash device. However, the semiconductor device according to various embodiments of the present inventive concepts may be used in all interconnection structures of a semiconductor device having a stepped end structure. For example, if the active pattern AP is replaced with a vertical electrode and the gate dielectric 8 is replaced with a variable resistance layer, the semiconductor device according to the inventive concept may be a vertical variable resistance device.

Figure 8:
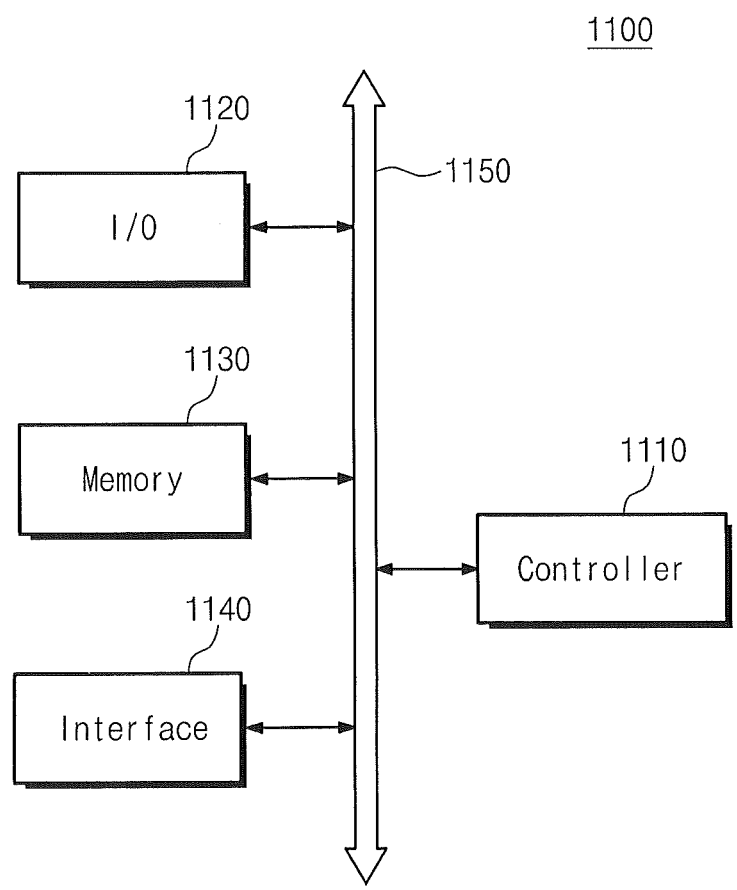
FIG. 8 is a schematic block diagram illustrating an example of a memory system including a three-dimensional semiconductor device according to various embodiments of the present inventive concepts.

FIG. 8 is a schematic block diagram illustrating an example of a memory system including a three-dimensional semiconductor device according to various embodiments of the present inventive concepts. Referring to FIG. 8, the memory system 1100 may be applied to a personal digital assistant (PDA), a portable computer, a web tablet, a wireless phone, a mobile phone, a digital music player, a memory card, and all devices that may transmit and/or receive data in a wireless environment.

The memory system 1100 includes an input/output device 1120, such as a controller 1110, a keypad, a key board, and a display, a memory 1130, an interface 1140, and a bus 1150. The memory 1130 and the interface 1140 intercommunicate through the bus 1150.

The controller 1110 includes at least one micro processor, a digital signal processor, a micro controller, and other similar process devices. The memory 1130 may be used to store an order performed by the controller 1110. The input/output device 1120 may input data or a signal from the outside of the system 1100 or may output data or a signal to the outside of the system. For example, the input/output device 1120 may include the keyboard, the key pad, and the display device.

The memory 1130 may include a non-volatile memory device according to various embodiments of the present inventive concepts. The memory 1130 may further include another kind of memory, a randomly accessible volatile memory, and various other kinds of memories. Moreover, the interface 1140 may act to dispatch data to a communication network, or to receive data from the network.

Figure 9:
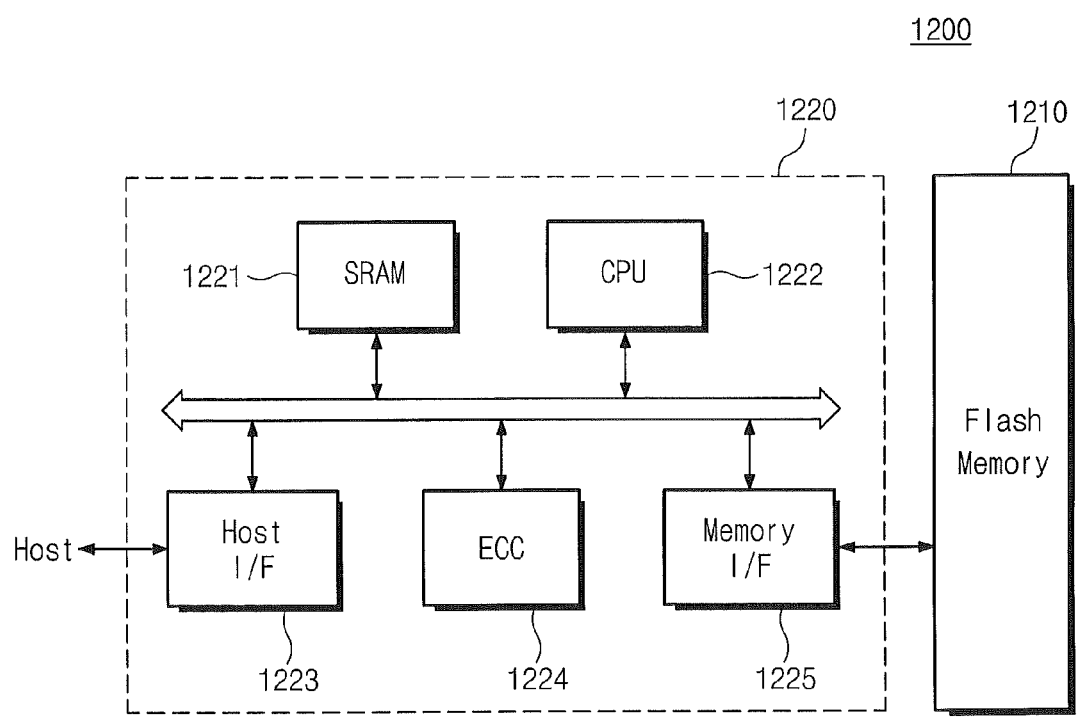
FIG. 9 is a schematic block diagram illustrating an example of a memory card having a three-dimensional semiconductor device according to various embodiments of the present inventive concepts.

FIG. 9 is a schematic block diagram illustrating an example of a memory card having a three-dimensional semiconductor device according to various embodiments of the present inventive concepts. Referring to FIG. 9, the memory card 1200, which may support a high volume of data storage capacity, mounts a flash memory device 1210 according to various embodiments of the present inventive concepts. The memory card 1200 according to various embodiments of the present inventive concepts may include a memory controller 1220 that controls various data exchanges between a host and the flash memory 1210.

A static random access memory (SRAM) 1221 may be used as a working memory of a processing unit 1222. A host interface (I/F) 1223 may have a data exchange protocol of the host contacting the memory card 1200. An error correction code (ECC) 1224 may detect and correct an error that is included in the data read out from the multi-bit flash memory device 1210. A memory interface (I/F) 1225 may interface with the flash memory device 1210 of various embodiments of the present inventive concepts. The processing unit 1222 may perform various control actions for data exchange of the memory controller 1220. It will be understood that the memory card 1200 according to various embodiments of the present inventive concepts may be further supplied with a read only memory (ROM) or the like that stores code data for interfacing with the host.

According to the flash memory device and the memory card or the memory system of various embodiments of the present inventive concepts, a memory system having high reliability may be provided through the flash memory device 1210 in which erase characteristics of dummy cells are improved. In particular, the flash memory device according to various embodiments of the present inventive concepts may be provided in a memory system such as solid state disk (hereinafter, referred to as "SSD"). In this case, a read error caused by the dummy cells may be reduced/prevented to realize a memory system having high reliability.

Figure 10:
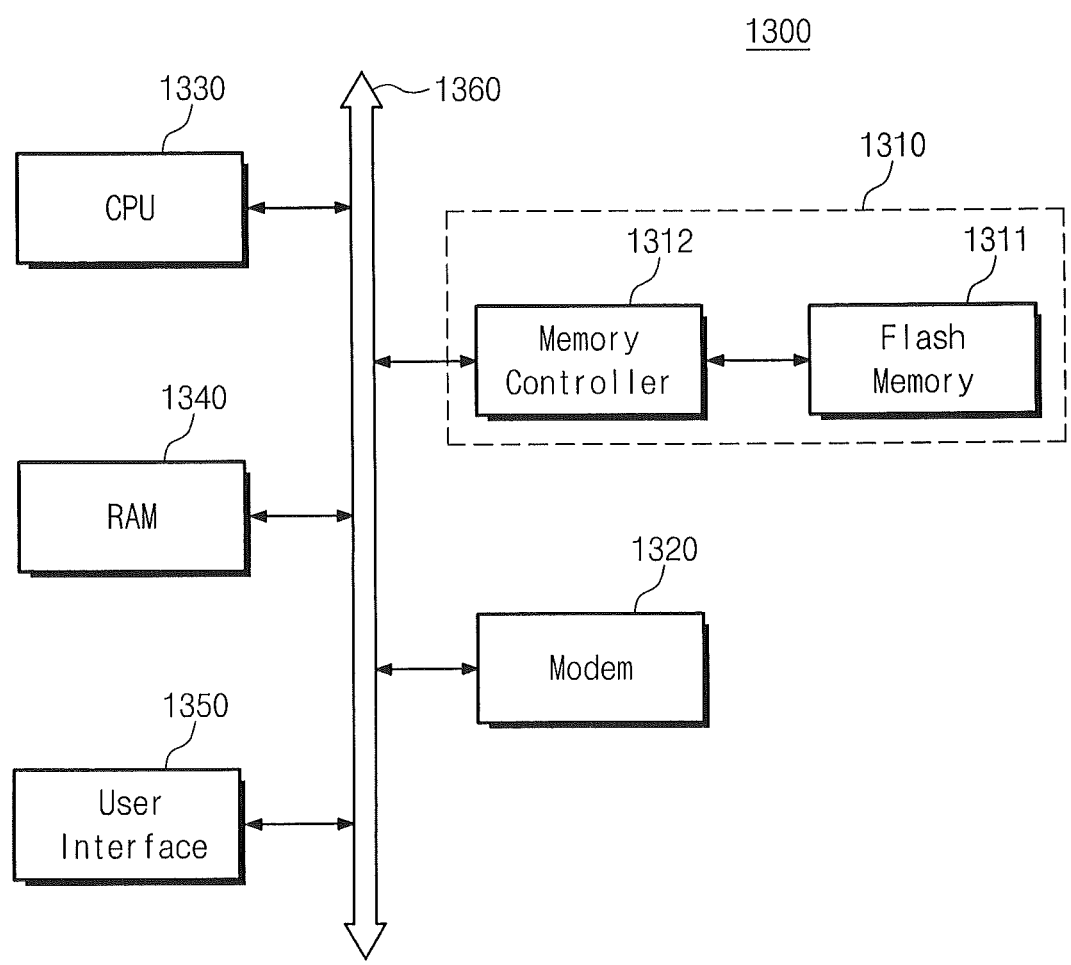
FIG. 10 is a schematic block diagram illustrating an example of a data processing system mounting a three-dimensional semiconductor device according to various embodiments of the present inventive concepts.

FIG. 10 is a schematic block diagram illustrating an example of a data processing system mounting the three-dimensional semiconductor device according to various embodiments of the present inventive concepts. Referring to FIG. 10, a flash memory system 1310 of various embodiments of the present inventive concepts is mounted on a data processing system such as a mobile device or a desktop computer. The data processing system 1300 according to various embodiments of the present inventive concepts may include the flash memory system 1310, a modem 1320, a central processing unit (CPU) 1330, a random access memory (RAM) 1340, and a user interface 1350, each of which electrically connects to a system bus 1360. The flash memory system 1310 may be composed substantially equal to the memory system or the flash memory system described herein. In the flash memory system 1310, the data processed by the central processing unit 1330 or the data input from the outside may be stored. Herein, the flash memory system 1310 may be composed of a solid state disk (SSD), and in this case, the data processing system 1300 may stably store a high volume of data in the flash memory system 1310. Due to the increase in reliability, the flash memory system 1310 may reduce the resources required for an error correction, thereby providing a high-speed data exchange function to the data processing system 1300. It will be understood that the data processing system 1300 according to various embodiments of the present inventive concepts may be further supplied with an application chipset, a camera image processor (CIS), and an input/out device or the like.

Also, the flash memory device or the memory system according to various embodiments of the present inventive concepts may be mounted by various types of packages. For example, the flash memory device or the memory system according to various embodiments of the present inventive concepts may be mounted by packaging in such types as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), system in package (SIP), multi chip package (MCP), wafer-level fabricated package (WFP), wafer-level processed stack package (WSP), and the like.

A semiconductor device according to various embodiments of the present inventive concepts may increase the degree of freedom in interconnection by including a connection plate.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
a substrate;
spaced-apart first and second conductive lines extending in a first direction on the substrate;
an interlayer dielectric on the first and second conductive lines;
first and second contact plugs in the interlayer dielectric and contacting the first and second conductive lines, respectively; and
a connection structure configured to electrically connect the first and second conductive lines, the connection structure comprising a connection element extending in a second direction that intersects the first direction,
wherein the connection element is disposed in the interlayer dielectric,
wherein the connection element is vertically non-overlapping with the first and second conductive lines and is spaced apart from the first and second contact plugs, and
wherein a top surface of the connection element is substantially coplanar with respective top surfaces of the first and second contact plugs.

2. The semiconductor device of claim 1, wherein the connection structure further comprises:
an interconnection configured to electrically connect the first and second contact plugs and the connection element,
wherein a width of the connection element is wider than a width of either of the first and second contact plugs.

3. The semiconductor device of claim 1, further comprising a third conductive line between the first and second conductive lines and spaced apart therefrom,
wherein a height of a lowermost surface of the third conductive line is equivalent to or lower than the height of uppermost surfaces of the first and second conductive lines, relative to an uppermost surface of the substrate.

4. The semiconductor device of claim 3, wherein the third conductive line and the connection element comprise an equivalent material.

5. The semiconductor device of claim 1, wherein:
the semiconductor device further comprises third and fourth conductive lines spaced apart from the first and second conductive lines and adjacent the interlayer dielectric;
the connection structure comprises a first connection structure; and
the semiconductor device further comprises a second connection structure configured to electrically connect the third and fourth conductive lines and spaced apart from the first connection structure,
wherein the first through fourth conductive lines define a step-shaped pattern.

6. The semiconductor device of claim 5, wherein:
the connection element comprises a first connection element;
the second connection structure comprises a second connection element spaced apart from the first connection element and extending in the second direction, the second connection element comprising an uppermost surface substantially coplanar with an uppermost surface of the interlayer dielectric.

7. A semiconductor device comprising:
a substrate;
a plurality of word lines on the substrate;
a dielectric layer on the substrate and adjacent the plurality of word lines;
a connection element comprising a conductive material in the dielectric layer, the connection element spaced apart from, and non-overlapping with, the plurality of word lines;
a plurality of contacts on the connection element; and
a conductive interconnection on one of the plurality of contacts that are on the connection element and on a contact that is spaced apart from the connection element.

8. The semiconductor device of claim 7, further comprising a selection line underlying the plurality of word lines, wherein the contact that is spaced apart from the connection element overlaps the selection line.

9. The semiconductor device of claim 8, wherein the connection element is spaced apart from, and non-overlapping with, the selection line.

10. The semiconductor device of claim 9, further comprising a common source line underlying the dielectric layer, wherein the connection element overlaps the common source line.

11. The semiconductor device of claim 7, wherein:
the one of the plurality of contacts on the connection element comprises a first contact on the connection element;
the semiconductor device further comprises a second contact, among the plurality of contacts, on the connection element;
the conductive interconnection comprises a first conductive interconnection on the first contact;
the semiconductor device further comprises a second conductive interconnection on the second contact that is on the connection element and on another contact that is spaced apart from the connection element; and
the semiconductor device further comprises a third conductive interconnection that is between the first and second conductive interconnections and that overlaps the plurality of word lines.

12. The semiconductor device of claim 11, further comprising:
a selection line underlying the plurality of word lines; and
a connection contact configured to electrically connect the selection line to one of:
the contact that is spaced apart from the connection element; and
the another contact that is spaced apart from the connection element.

13. The semiconductor device of claim 12, wherein:
the connection contact comprises a first connection contact; and
the semiconductor device further comprises a second connection contact that is configured to electrically connect the third conductive interconnection to one of the plurality of word lines.

14. A semiconductor device comprising:
a substrate;
a plurality of word lines on the substrate and extending in a first direction;
a plurality of active patterns penetrating the plurality of word lines;
a dielectric layer on the substrate and adjacent the plurality of word lines;
a connection element comprising a conductive material in the dielectric layer, the connection element being spaced apart from the plurality of the word lines and extending in a second direction intersecting the first direction;
a plurality of contacts on the connection element;
a first conductive interconnection on one of the plurality of contacts that are on the connection element; and
a first connection contact that is spaced apart from the connection element and is on one of the plurality of word lines;
a second conductive interconnection on the first connection contact,
wherein the first connection contact is in the dielectric layer, and
wherein a top surface of the first connection contact is substantially coplanar with a top surface of the connection element.

15. The semiconductor device of claim 14, further comprising a selection line underlying the plurality of word lines,
wherein the first connection contact overlaps the one of the plurality of word lines, and
wherein the plurality of active patterns penetrate the selection line.

16. The semiconductor device of claim 15, wherein the connection element is spaced apart from, and non-overlapping with, the plurality of word lines and the selection line.

17. The semiconductor device of claim 16, further comprising a second connection contact on the selection line, wherein the second connection contact is spaced apart from the first connection contact.

18. The semiconductor device of claim 14, wherein:
the one of the plurality of contacts on the connection element comprises a first contact on the connection element;
the semiconductor device further comprises a second contact, among the plurality of contacts, on the connection element;
the first conductive interconnection is on the first contact;
the second conductive interconnection is on the second contact and on a second connection contact that is spaced apart from the connection element and the first connection contact; and
the semiconductor device further comprises a third conductive interconnection that is between the first and second conductive interconnections and that overlaps the plurality of word lines.

19. The semiconductor device of claim 18, further comprising:
a selection line underlying the plurality of word lines; and
a third contact configured to electrically connect one of the first and second conductive interconnections to the selection line,
wherein the third contact is on one of:
the first connection contact; and
the second connection contact.

20. The semiconductor device of claim 18, further comprising
a third contact on the first connection contact,
wherein the third contact is configured to electrically connect the second conductive interconnection to one of the plurality of word lines.

* * * * *